United States Patent
Hsu et al.

(10) Patent No.: US 6,649,957 B2
(45) Date of Patent: Nov. 18, 2003

(54) THIN FILM POLYCRYSTALLINE MEMORY STRUCTURE

(75) Inventors: Sheng Teng Hsu, Camas, WA (US); Tingkai Li, Vancouver, WA (US); Fengyan Zhang, Vancouver, WA (US); Wei-Wei Zhuang, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/345,725

(22) Filed: Jan. 15, 2003

(65) Prior Publication Data

US 2003/0180969 A1 Sep. 25, 2003

Related U.S. Application Data

(62) Division of application No. 10/099,186, filed on Mar. 13, 2002, now Pat. No. 6,534,326.

(51) Int. Cl.$^7$ ............................................. H01L 29/76
(52) U.S. Cl. ........................................ 257/295; 257/310
(58) Field of Search ................................ 257/295, 296, 257/310, 297; 438/3, 240

(56) References Cited

U.S. PATENT DOCUMENTS

| | | | | |
|---|---|---|---|---|
| 5,854,499 A | * | 12/1998 | Nishioka | 257/295 |
| 6,143,597 A | * | 11/2000 | Matsuda et al. | 438/240 |
| 2001/0018132 A1 | * | 8/2001 | Hartner et al. | 428/469 |

* cited by examiner

Primary Examiner—Tuan H. Nguyen
(74) Attorney, Agent, or Firm—Matthew D. Rabdau; David C. Ripma; Scott C. Krieger

(57) ABSTRACT

A polycrystalline memory structure is described for improving reliability and yield of devices employing polycrystalline memory materials comprising a polycrystalline memory layer, which has crystal grain boundaries forming gaps between adjacent crystallites overlying a substrate. An insulating material is located at least partially within the gaps to at least partially block the entrance to the gaps. A method of forming a polycrystalline memory structure is also described. A layer of material is deposited and annealed to form a polycrystalline memory material having gaps between adjacent crystallites. An insulating material is deposited over the polycrystalline memory material to at least partially fill the gaps, thereby blocking a portion of each gap.

13 Claims, 3 Drawing Sheets

THIN FILM POLYCRYSTALLINE MEMORY STRUCTURE

This application is a divisional of application Ser. No. 10/099,186, filed Mar. 13, 2002, entitled "Method of Minimizing Leakage Current and Improving Breakdown Voltage of Polycrystalline Memory Thin Films," invented by Sheng Teng Hsu, Tingkai Li, Fengyan Zhang, and Wei-Wei Zhuang, now U.S. Pat. No. 6,534,326.

BACKGROUND OF THE INVENTION

The present invention relates to semiconductor devices and processes, and more particularly to devices comprising a polycrystalline memory material, such as a perovskite, or ferroelectric, thin film.

Polycrystalline thin films are used in several known memory devices, such as ferroelectric memory devices and other perovskite memory devices. The memory device could be a Metal/Ferroelectric/Metal (MFM) capacitor, a gate stack of Metal/Ferroelectric/Insulator/Semiconductor (MFIS) for single transistor memory or Metal/Ferroelectric/Metal/Insulator/Semiconductor (MFMIS) gate stack memory transistor. A two terminal memory can also be fabricated with polycrystalline memory materials, such as, colossal magneto-resistive (CMR) materials, and high temperature super-conducting (HTSC) materials. Some of these memory structures have been demonstrated and studied extensively over the past ten years producing a memory cell with many outstanding characteristics. However, large arrays of these memory structures have not been successfully fabricated due to the presence of leaky memory cells. Even the presence of a few leaky memory cells can so significantly reduce functionality and yield as to impair the technical and economic viability of these materials in large memory arrays.

This leakage is due in part to the polycrystalline form of the materials used. In order for the ferroelectric materials to have good ferroelectric properties, the materials are preferably in crystalline form, including polycrystalline form. Other, memory materials may also need to be in crystalline, or polycrystalline, form to produce the desired properties.

SUMMARY OF THE INVENTION

A polycrystalline memory structure is described for improving reliability and yield of devices employing polycrystalline memory materials comprising a polycrystalline memory layer, which has crystal grain boundaries forming gaps between adjacent crystallites overlying a substrate. An insulating material is located at least partially within the gaps to at least partially block the entrance to the gaps, so the amount of subsequently deposited metal entering the gaps is reduced, or eliminated.

A method of forming a polycrystalline memory structure is also described. A layer of material is deposited and annealed to form a polycrystalline memory material having gaps between adjacent crystallites. An insulating material is deposited over the polycrystalline memory material to at least partially fill the gaps, thereby blocking a portion of each gap.

DETAILED DESCRIPTION OF THE INVENTION

Polycrystalline memory material refers to a material that is polycrystalline after deposition, or deposition and annealing, which is suitable for non-volatile memory applications. Polycrystalline memory material has grain boundaries between adjacent crystallites. These grain boundaries form at least one gap between crystallites. The polycrystalline memory material also has a rough upper surface. When a top metal electrode is deposited overlying the polycrystalline memory material, the metal may deposit into the gaps between crystallites. Metal in the gaps causes the distance between the top electrode and any bottom electrode to be smaller than the distance between metal at the top of the crystallite and the bottom electrode. The deposited metal may continue to diffuse further into the gap along the grain boundaries during subsequent processing. The metal in the gap between crystallites may produce a short between the top electrode and the bottom electrode. Even if a short is not formed, the electric field intensity due to metal in the gap is substantially larger than that at the top surface of the crystallite. The increased electric field intensity is one possible source of increased leakage current and low breakdown voltage. In some cases, the leakage current may be sufficiently large to severely affect the charge retention of the memory device. The presence of metal in the gap between crystallites presents a severe fabrication yield and device reliability problem for individual memory cells. This problem is amplified with regard to arrays of memory cells, where the failure of only a few cells causes the loss of an entire memory array.

The problem of gaps between crystallites and the effect of metal filing those gaps applies to a variety of polycrystalline memory materials, including perovskite materials, ferroelectric materials, colossal magneto-resistive (CMR) materials, and high temperature superconducting (HTSC) materials.

Figure 1:
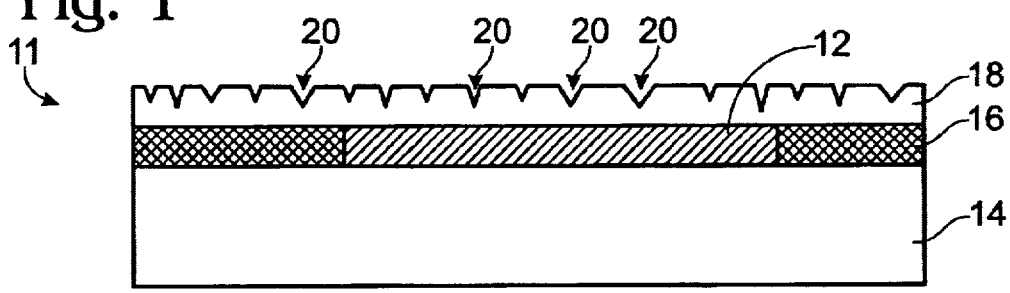
FIG. 1 is a cross sectional view of a device structure during processing.

Referring now to FIG. 1, a device structure 11 is shown during processing. A bottom electrode 12 has been formed overlying a substrate 14. The substrate 14 is a silicon substrate, or other suitable substrate material, including other semiconductor materials or semiconductor on insulator substrates. In one embodiment, the substrate is formed by depositing a layer of oxide 16 and etching a trench where the bottom electrode 12 is to be formed. The metal used to form the bottom electrode 12 is deposited overlying the oxide 16 and the substrate 14 to fill the trench. The metal is then planarized, for example using a CMP process, to form the bottom electrode. The bottom electrode 12 is preferably a noble metal or a conductive noble metal oxide, for example platinum, iridium, iridium oxide, ruthenium oxide, or iridium tantalum oxide.

After forming the bottom electrode 12, a polycrystalline memory layer 18 is formed by depositing material overlying the bottom electrode and annealing the material. The polycrystalline memory layer has grain boundaries which forms gaps 20. The gaps 20 may vary in size and depth, and may extend completely through the polycrystalline memory layer 18 to the bottom electrode 12. The polycrystalline memory material is a perovskite material, a ferroelectric material, a CMR material, or a HTSC material. The polycrystalline memory material may be selected from $PbZr_xTi_{1-x}O_3$ (PZT), $(Pb,La)(ZrTi)O_3$ (PLZT), $(PbLa)TiO_3$ (PLT), $SrBi_2Ta_2O_9$ (SBT), $SrBi2(Ta_{1-x}Nb_x)_2O_9$ (SBTN), $(Ba,Sr)TiO_3$ (referred to as BST or BSTO), $Pb_5Ge_3O_{11}$ (PGO), $(Pb_{1-x}Sn_x)_5Ge_3O_{11}$ (PSGO), or other perovskite material, ferroelectric material, or suitable polycrystalline memory material.

Figure 2:
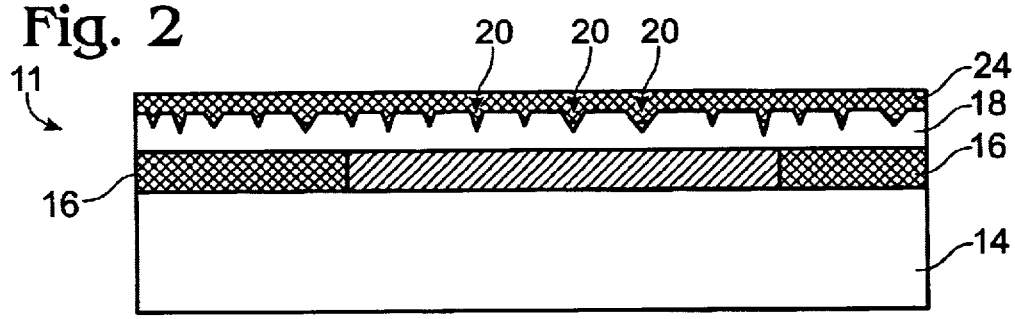
FIG. 2 is a cross sectional view of a device structure during processing.

Referring now to FIG. 2 an insulating layer 24 is deposited overlying the polycrystalline memory layer 18. The insulating layer 24 at least partially fills the gaps 20 to plug the gaps and reduce, or eliminate, the amount of subsequently deposited metal entering the gaps 20. Although, the insulating layer 24, may in some cases completely fill one or more gaps, it is not necessary for the insulating layer 24 to completely fill the gaps 20. The insulating layer will either partially block the opening of the gaps 20, or completely block the opening of the gaps 20, to reduce or eliminate, the amount of subsequently deposited metal entering the gaps. This insulating layer 24 may comprise silicon oxide, silicon nitride, or high-k insulating materials such as hafnium oxide, zirconium oxide, aluminum oxide, aluminum nitride, tantalum oxide, aluminum-doped hafnium oxide, aluminum-doped zirconium oxide. The insulating layer 24 is deposited using chemical vapor deposition (CVD), sputtering, or other suitable method for depositing the desired material. As used here, CVD refers to any method of CVD, for example, plasma-enhanced CVD, atomic layer CVD, metal oxide CVD, or other CVD processes.

Figure 3:
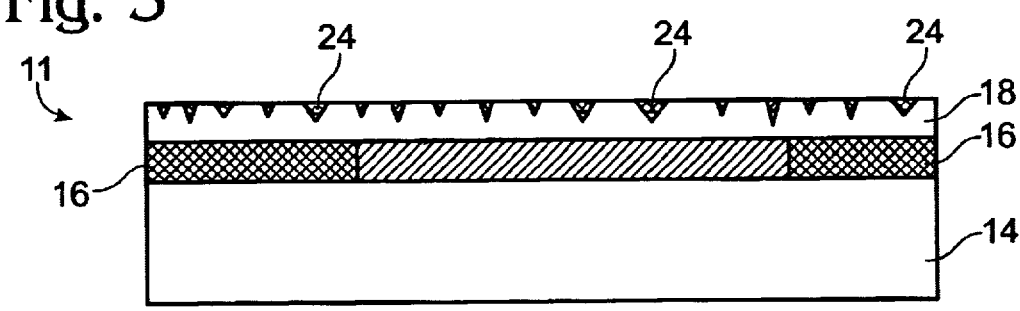
FIG. 3 is a cross sectional view of a device structure during processing.

Referring now to FIG. 3, the insulating layer 24 is planarized, for example using a CMP process. By planarizing the insulating layer 24, the polycrystalline memory layer 18 may be exposed. During the planarization of the insulating layer 24, a portion of the polycrystalline memory layer 18 may also be planarized.

In another embodiment, a portion of the insulating layer 24 may remain over the polycrystalline memory layer 18. Although, this may reduce the memory window and require the drain to be operated at higher voltages, the memory device is still operational without degrading reliability.

Figure 4:
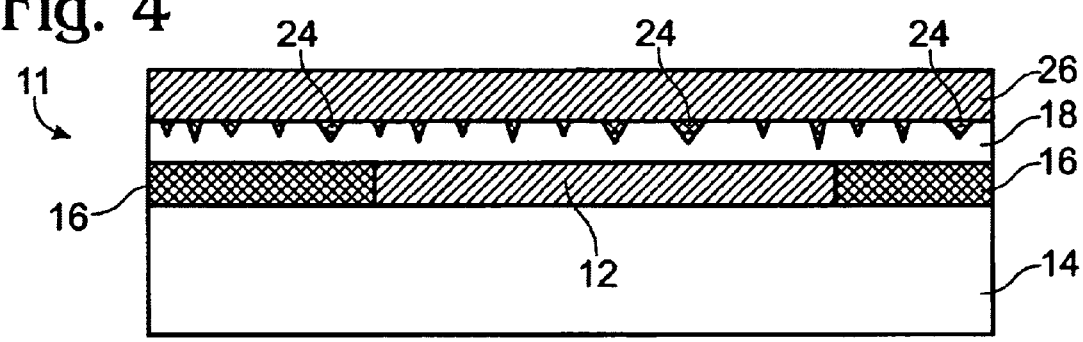
FIG. 4 is a cross sectional view of a device structure during processing.
Figure 5:
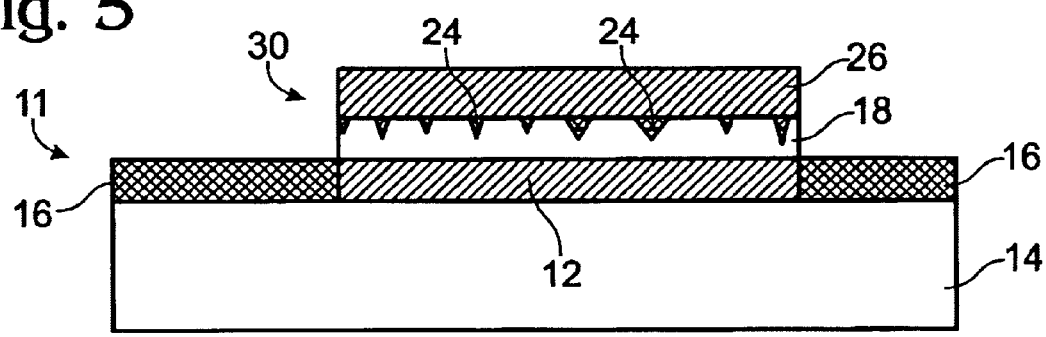
FIG. 5 is a cross sectional view of a device structure during processing.

Referring now to FIG. 4, a top electrode layer 26 is deposited over the insulating layer 24 and the polycrystalline memory layer 18. The top electrode layer may be a noble metal, or a conductive noble metal oxide, such as, platinum, iridium, iridium oxide, ruthenium oxide, or iridium tantalum oxide. The top electrode layer 26 is then patterned and etched to form a top electrode 28. The polycrystalline memory layer 18 is also patterned to complete the polycrystalline memory gate stack 30, which comprises the bottom electrode 12, a remaining portion of the polycrystalline memory layer 18, a remaining portion of the insulating layer 24, and the top electrode 28, as shown in FIG. 5. Additional well known processes may then be performed on the resulting device structure 11 to form a polycrystalline memory structure.

Figure 6:
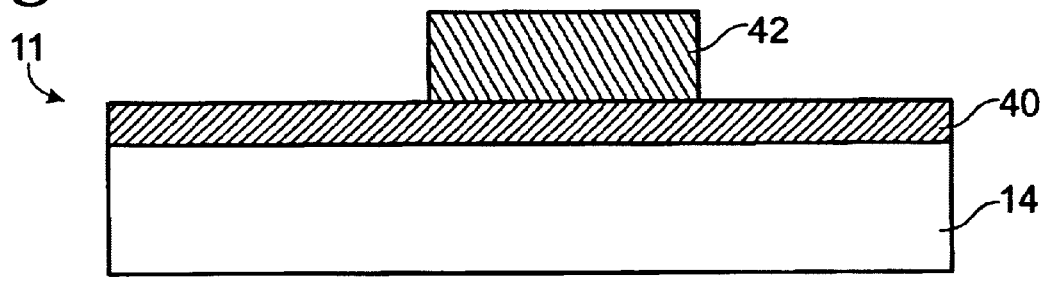
FIG. 6 is a cross sectional view of a device structure during processing.

An alternative embodiment of the device structure 11, utilizing a trench structure, is shown in FIGS. 6–10. As shown in FIG. 6, a bottom electrode layer 40 is deposited overlying the substrate 14. A silicon nitride layer, or other suitable sacrificial material, is deposited and patterned to form a sacrificial gate structure 42. The bottom electrode layer 40 is then etched, possibly using the sacrificial gate structure 42 as a mask. Alternatively, the bottom electrode layer may be etched using the same mask as that used to pattern the sacrificial gate structure.

Figure 7:
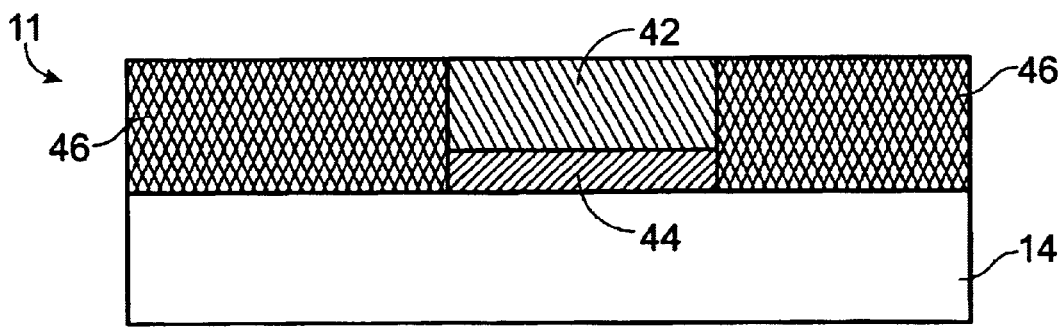
FIG. 7 is a cross sectional view of a device structure during processing.

Referring now to FIG. 7, after etching, a portion the bottom electrode layer remains as a bottom electrode 44. A layer of oxide 46, or other suitable insulating material, is then deposited overlying the substrate and the sacrificial gate structure. The oxide is then planarized, for example using a CMP process.

Figure 8:
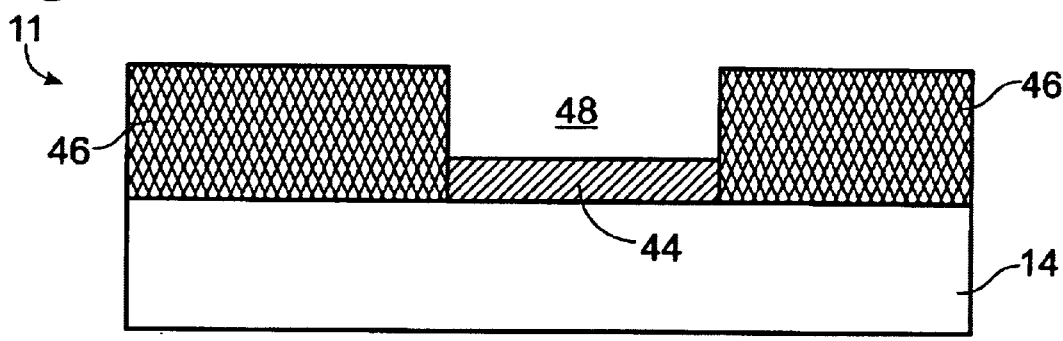
FIG. 8 is a cross sectional view of a device structure during processing.

Referring now to FIG. 8, the sacrificial gate structure is then removed leaving a trench 48. For example, if the sacrificial gate structure is composed of silicon nitride a hot phosphoric acid etch may be used to remove the sacrificial gate structure.

Figure 9:
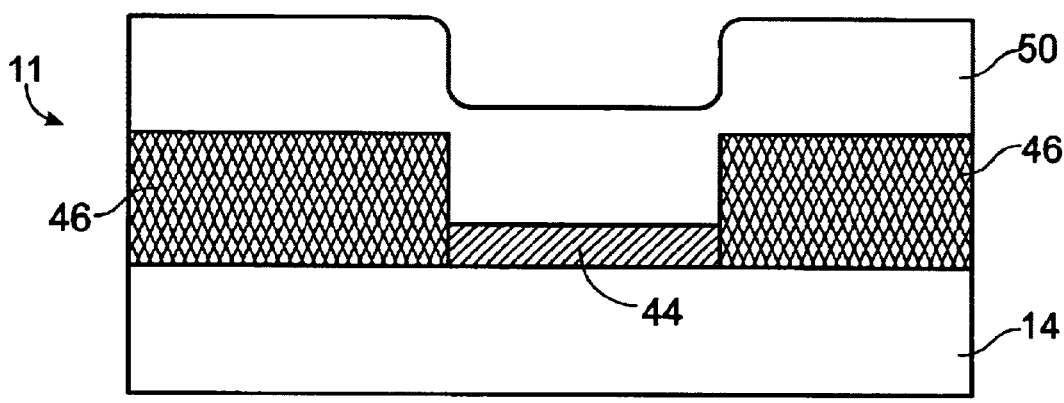
FIG. 9 is a cross sectional view of a device structure during processing.

Referring now to FIG. 9, the polycrystalline memory layer 50 is then deposited to fill the trench.

Figure 10:
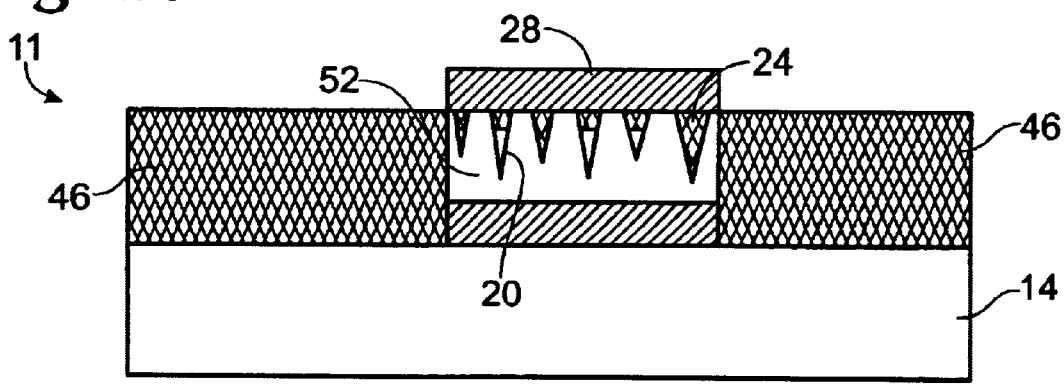
FIG. 10 is a cross sectional view of a device structure during processing.

Referring now to FIG. 10, the polycrystalline memory layer is then planarized to form a polycrystalline memory gate structure 52, for example using a CMP process. The polycrystalline memory gate structure 52 has gaps 20 formed at the boundaries of adjacent crystallites. The insulating layer 24 is then deposited over the polycrystalline memory layer, to block, or fill, the gaps 20. In one embodiment, the insulator layer is planarized and the top electrode 28 is formed by depositing and patterning a top metal layer.

The above illustrated embodiments illustrate a simple MFM capacitor. The present invention also applies to MFIS devices where an additional layer of insulating material, for example hafnium oxide or zirconium oxide, is deposited over the substrate instead of the bottom electrode and patterned.

In another embodiment, the additional layer of insulating material is deposited over the substrate prior to forming the bottom electrode, such that the additional layer of insulating material is interposed between the substrate and the bottom electrode. This forms a MFMIS structure. The additional layer of insulating material may be silicon dioxide, silicon nitride, or a high-k insulator material such as, hafnium oxide, zirconium oxide, aluminum oxide, aluminum nitride, tantalum oxide, aluminum-doped hafnium oxide, or aluminum-doped zirconium oxide.

The above examples are provided to illustrate aspects of the present invention. One of ordinary skill in the art may be able to adapt the invention to structures other than those identified above. Accordingly, the scope of the invention is to be determined by the following claims.

What is claimed is:

1. A polycrystalline memory structure comprising:
   a) a polycrystalline memory layer, which has crystal grain boundaries forming gaps between adjacent crystallites overlying a substrate;
   b) an insulating material located at least partially within the gaps;
   c) a bottom electrode interposed between the polycrystalline memory layer and the substrate; and
   d) a second insulating material which is selected from the group consisting of silicon nitride, hafnium oxide, zirconium oxide, aluminum oxide, aluminum nitride, tantalum oxide, aluminum-doped hafnium oxide, and aluminum-doped zirconium oxide, interposed between the bottom electrode and the substrate.

2. The polycrystalline memory structure of claim 1, wherein the polycrystalline memory layer is a perovskite material, a ferroelectric material, a colossal magneto-resistive (CMR) material, or a high temperature super-conducting (HTSC) material.

3. The polycrystalline memory structure of claim 1, wherein the polycrystalline memory layer is PZT, PLZT, PLT, SBT, SBTN, BST, BSTO, PGO, or PSGO.

4. The polycrystalline memory structure of claim 1, wherein the insulating material is silicon dioxide, silicon nitride, hafnium oxide, zirconium oxide, aluminum oxide, aluminum nitride, tantalum oxide, aluminum-doped hafnium oxide, or aluminum-doped zirconium oxide.

5. The polycrystalline memory structure of claim 1, wherein the bottom electrode is iridium, platinum, ruthenium oxide, or iridium tantalum oxide.

6. The polycrystalline memory structure of claim 1, further comprising a top electrode overlying the polycrystalline memory layer.

7. The polycrystalline memory structure of claim 6, wherein the top electrode is platinum, iridium, iridium oxide, ruthenium oxide, or iridium tantalum oxide.

8. A polycrystalline memory structure comprising:
   a) a polycrystalline memory layer, which has crystal grain boundaries forming gaps between adjacent crystallites overlying a substrate;
   b) an insulating material located at least partially within the gaps; and
   c) a layer of hafnium oxide or zirconium oxide interposed between the polycrystalline memory layer and the substrate.

9. The polycrystalline memory structure of claim 8, wherein the polycrystalline memory layer is a perovskite material, a ferroelectric material, a colossal magneto-resistive (CMR) material, or a high temperature super-conducting (HTSC) material.

10. The polycrystalline memory structure of claim 8, wherein the polycrystalline memory layer is PZT, PLZT, PLT, SBT, SBTN, BST, BSTO, PGO, or PSGO.

11. The polycrystalline memory structure of claim 8, wherein the insulating material is silicon dioxide, silicon nitride, hafnium oxide, zirconium oxide, aluminum oxide, aluminum nitride, tantalum oxide, aluminum-doped hafnium oxide, or aluminum-doped zirconium oxide.

12. The polycrystalline memory structure of claim 8, further comprising a top electrode overlying the polycrystalline memory layer.

13. The polycrystalline memory structure of claim 12, wherein the top electrode is platinum, iridium, iridium oxide, ruthenium oxide, or iridium tantalum oxide.

* * * * *